(12) United States Patent
Komiyama et al.

(10) Patent No.: US 10,226,798 B2
(45) Date of Patent: Mar. 12, 2019

(54) MOUNTING HEAD CLEANING DEVICE AND MOUNTING HEAD CLEANING METHOD

(71) Applicant: FUJI CORPORATION, Chiryu (JP)

(72) Inventors: Nobuhisa Komiyama, Okazaki (JP); Kazumi Hoshikawa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 49 days.

(21) Appl. No.: 15/322,661

(22) PCT Filed: Jul. 3, 2014

(86) PCT No.: PCT/JP2014/067833
§ 371 (c)(1),
(2) Date: Dec. 28, 2016

(87) PCT Pub. No.: WO2016/002055
PCT Pub. Date: Jan. 7, 2016

(65) Prior Publication Data
US 2017/0151590 A1 Jun. 1, 2017

(51) Int. Cl.
B08B 9/32 (2006.01)
B08B 9/032 (2006.01)
H05K 13/04 (2006.01)
B08B 5/02 (2006.01)
H05K 13/08 (2006.01)

(52) U.S. Cl.
CPC ............ *B08B 9/0325* (2013.01); *B08B 5/023* (2013.01); *B08B 9/0327* (2013.01); *B08B 9/0328* (2013.01); *H05K 13/0404* (2013.01); *H05K 13/0408* (2013.01); *H05K 13/0409* (2018.08); *H05K 13/0895* (2018.08)

(58) Field of Classification Search
None
See application file for complete search history.

(56) References Cited

FOREIGN PATENT DOCUMENTS

JP 2011-3679 A 1/2011
WO WO 2013/153598 A1 10/2013

OTHER PUBLICATIONS

International Search Report dated Sep. 16, 2014 in PCT/JP2014/067833 filed Jul. 3, 2014.

*Primary Examiner* — Eric W Golightly
(74) *Attorney, Agent, or Firm* — Oblon, McClelland, Maier & Neustadt, L.L.P.

(57) ABSTRACT

A mounting head cleaning device is provided with a cleaning fluid supply device which supplies a cleaning fluid which is formed of positive pressure air or an oil mist to an air passage, and a control device which controls operations of a lifting and lowering mechanism and operations of a rotation mechanism, such that a nozzle shaft is lifted and lowered, and the nozzle shaft is rotated around an axial line in synchronization with a lifting and lowering operation of the nozzle shaft in a cleaning process which uses the cleaning fluid supply device.

7 Claims, 11 Drawing Sheets

[Fig. 1]
Prior Art
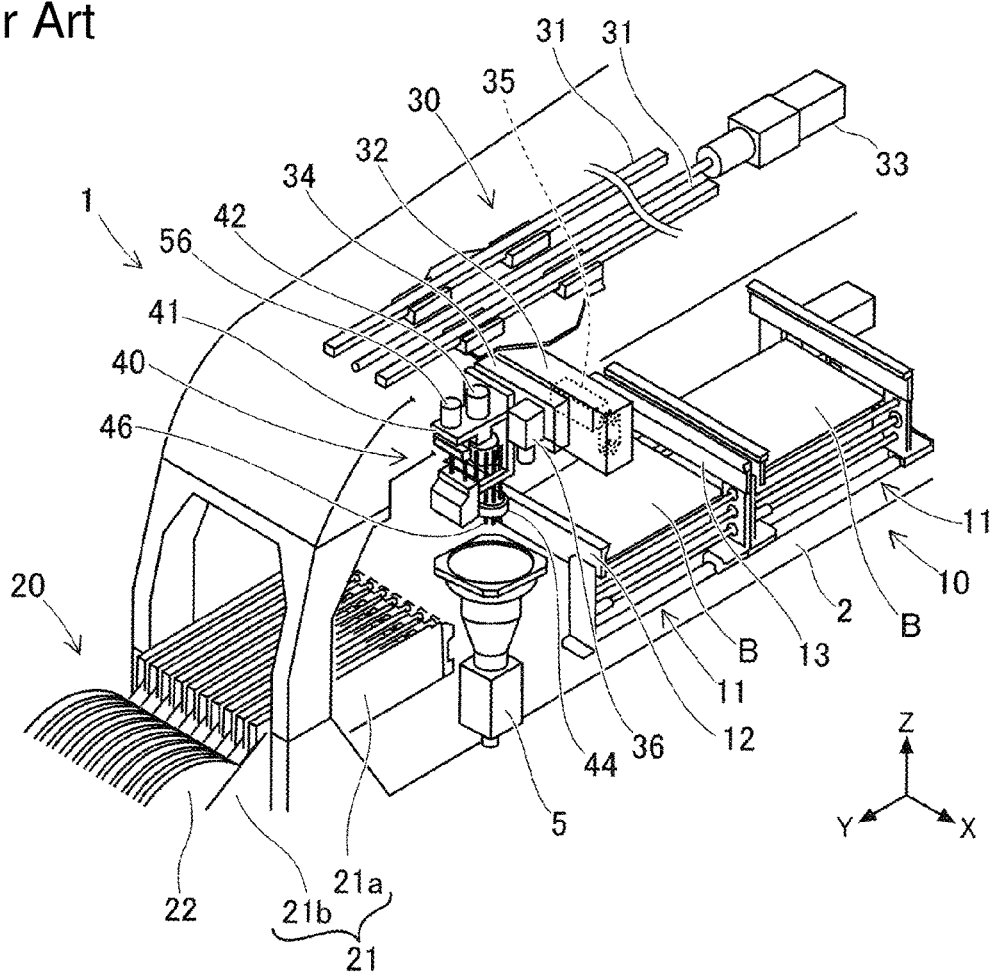

[Fig. 2]
Prior Art
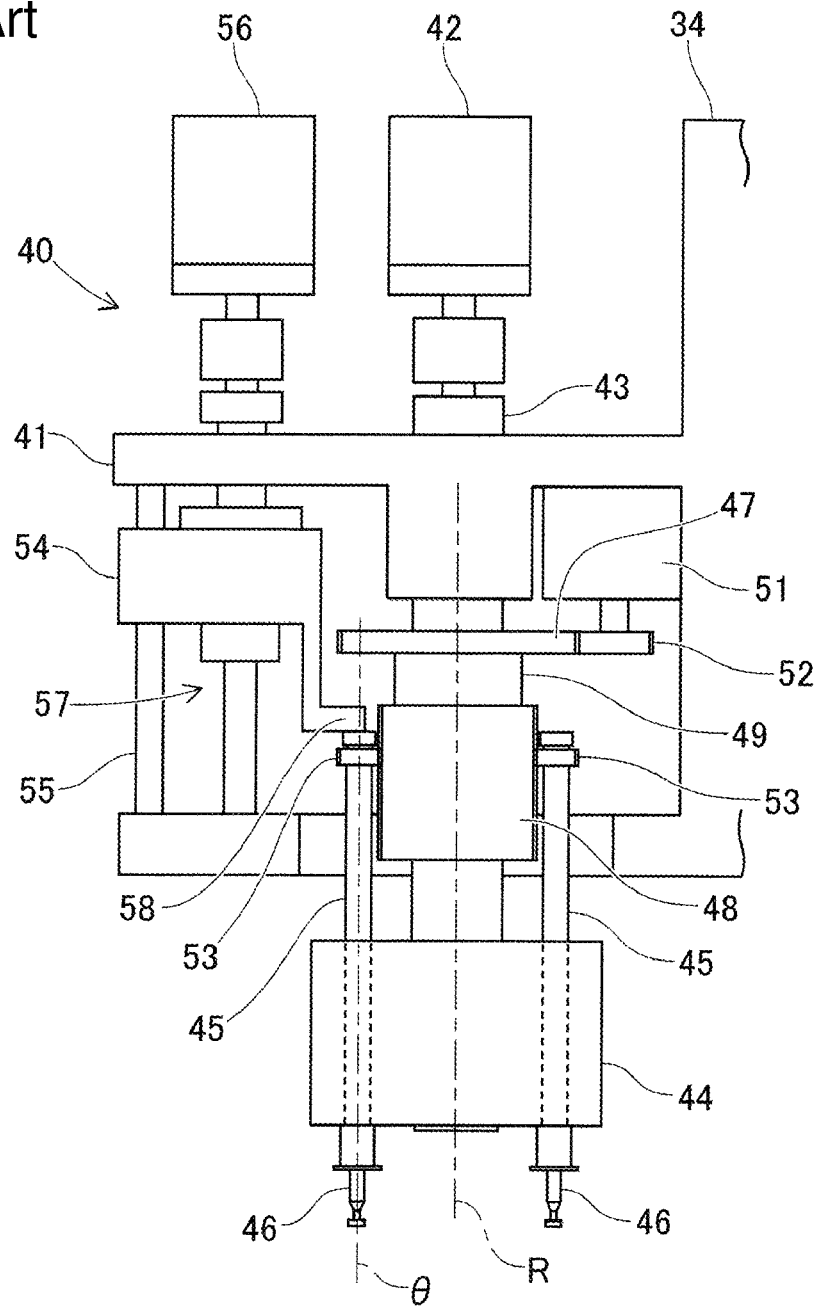

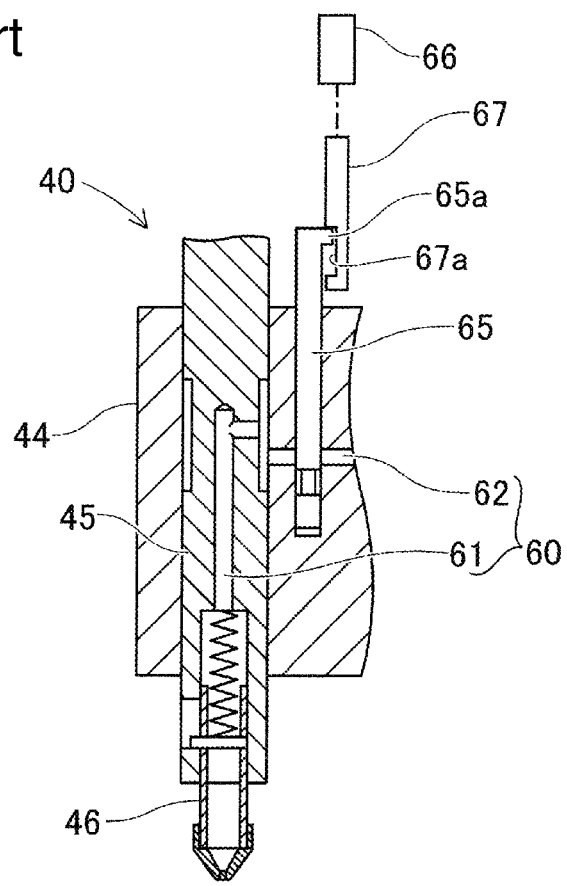
[Fig. 3]
Prior Art

[Fig. 4]
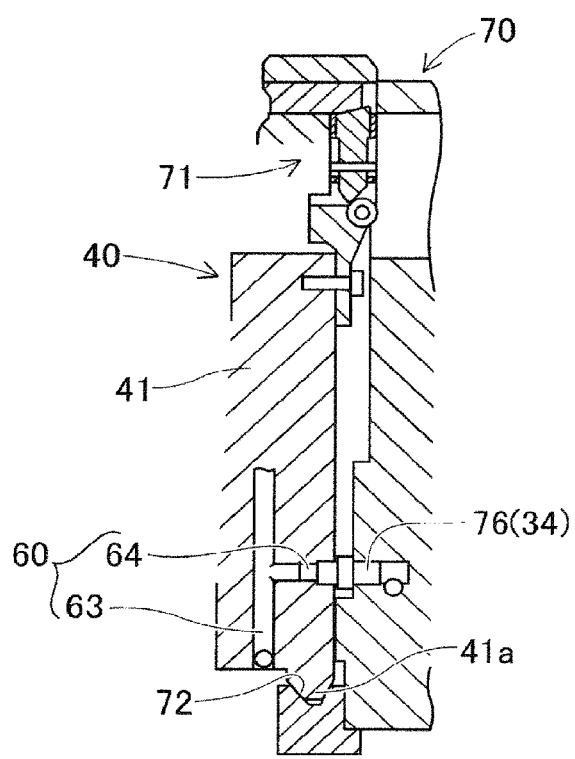

[Fig. 5]
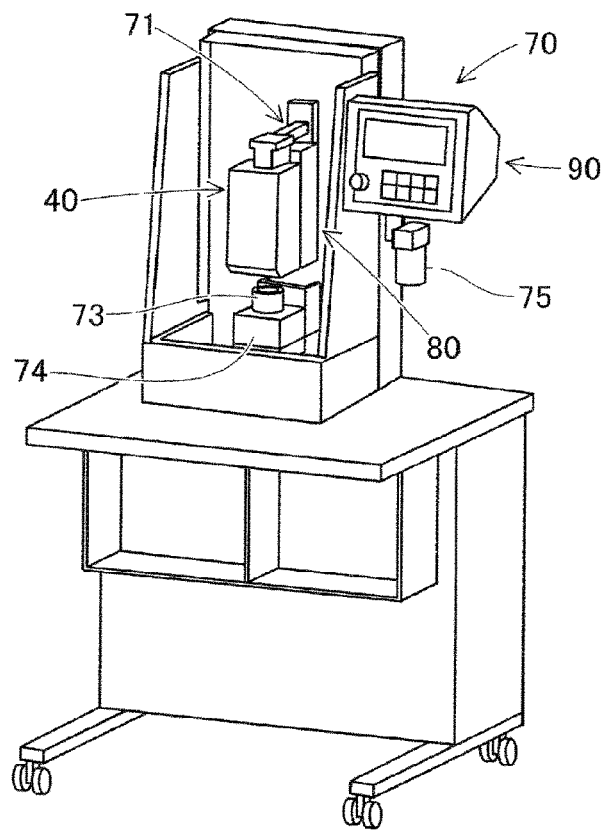

[Fig. 6]
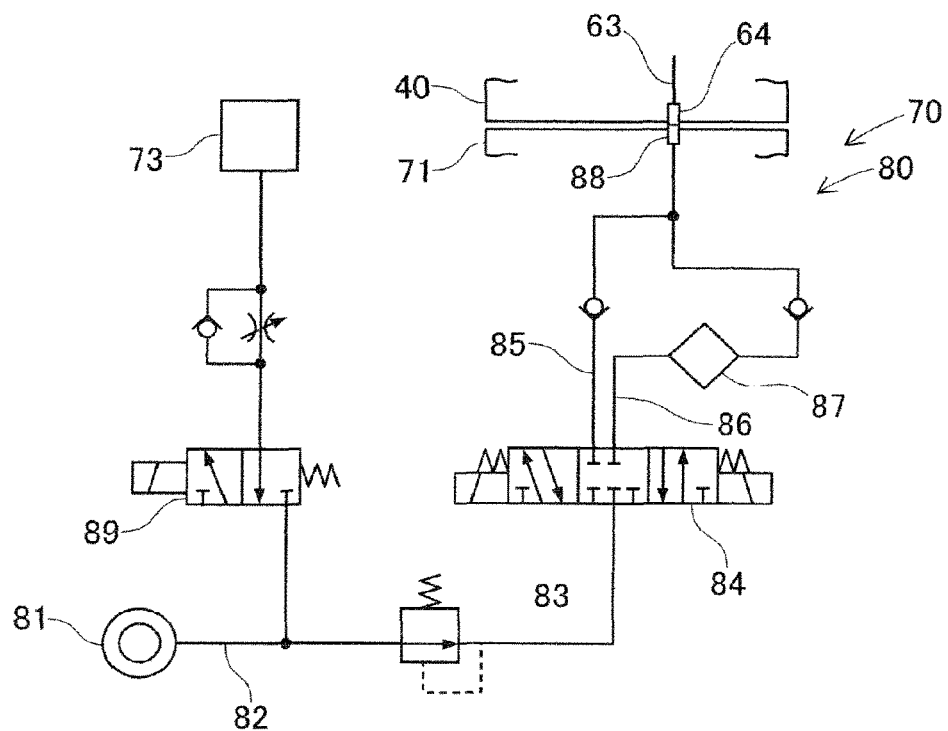

[Fig. 7]
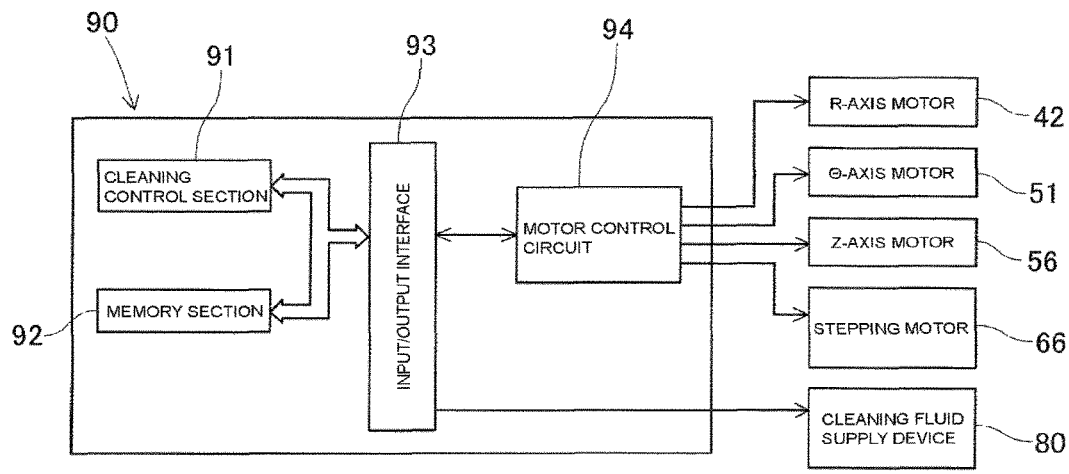

[Fig. 8]
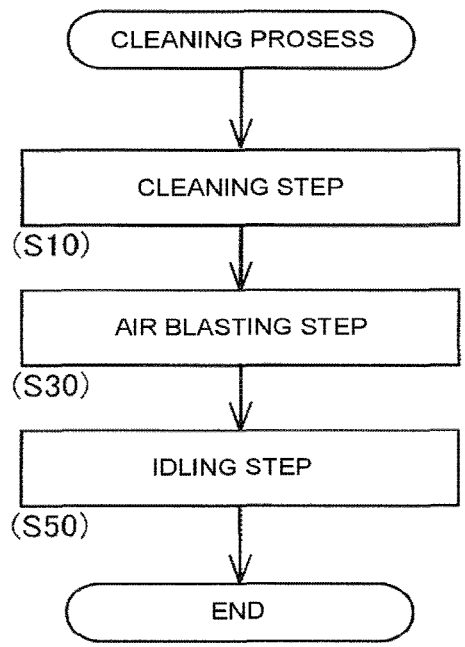

[Fig. 9]
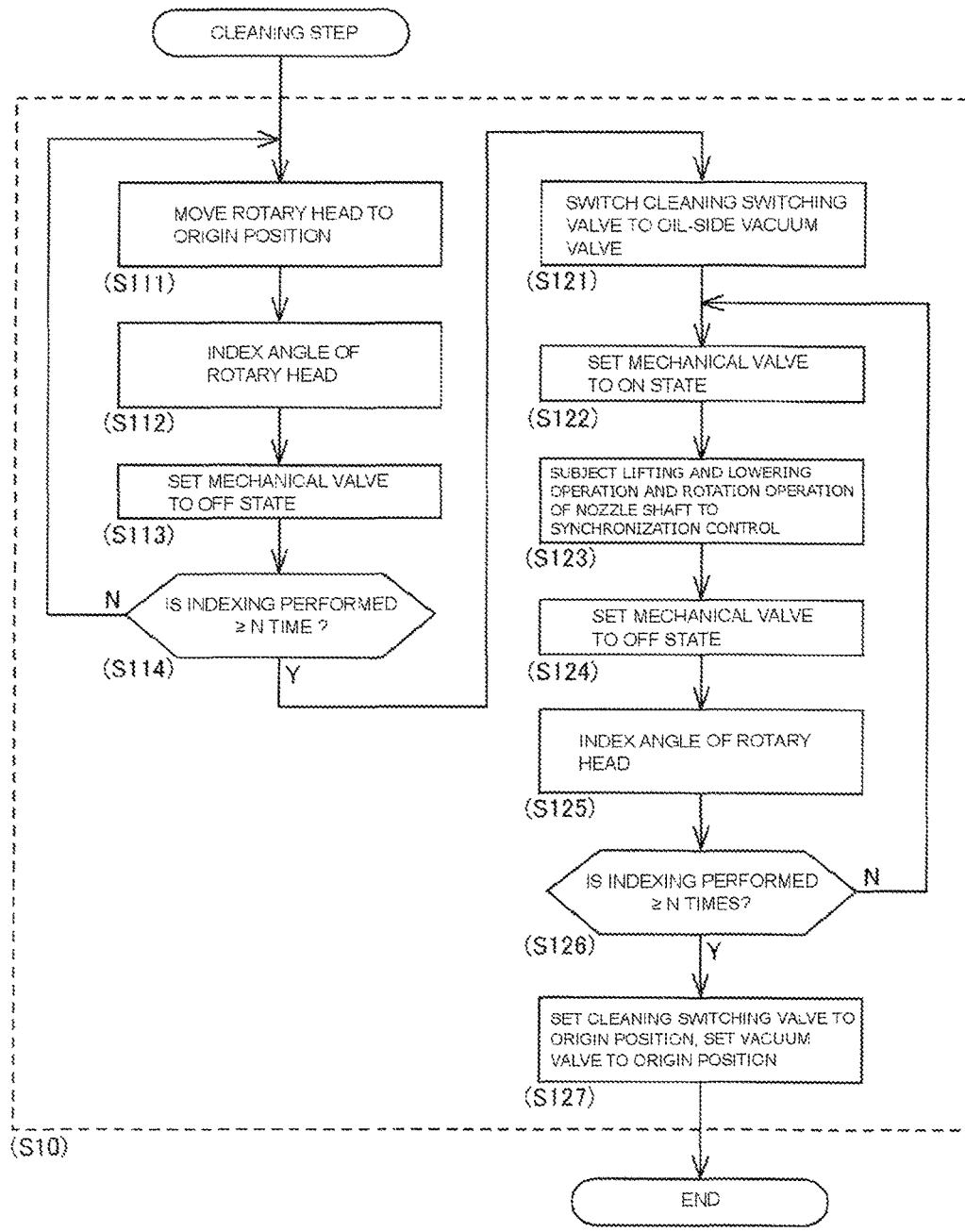

[Fig. 10]
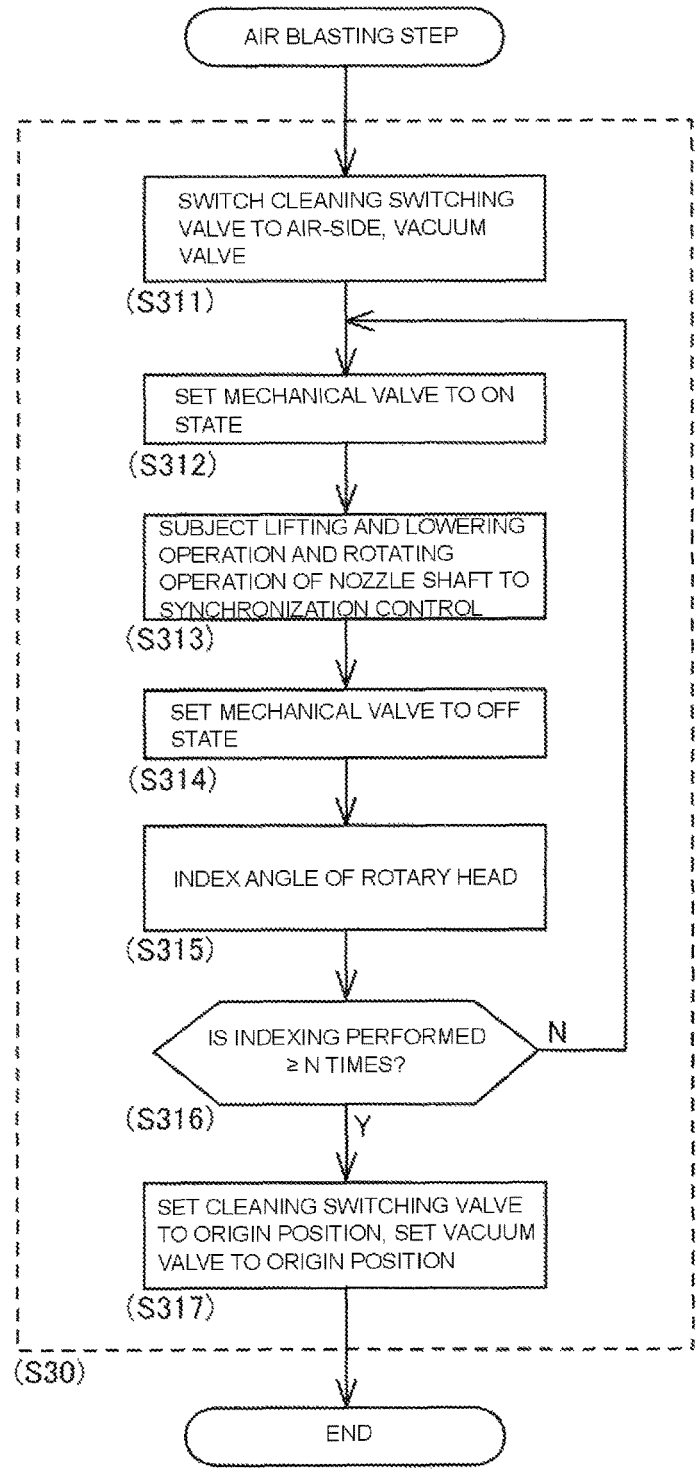

[Fig. 11]
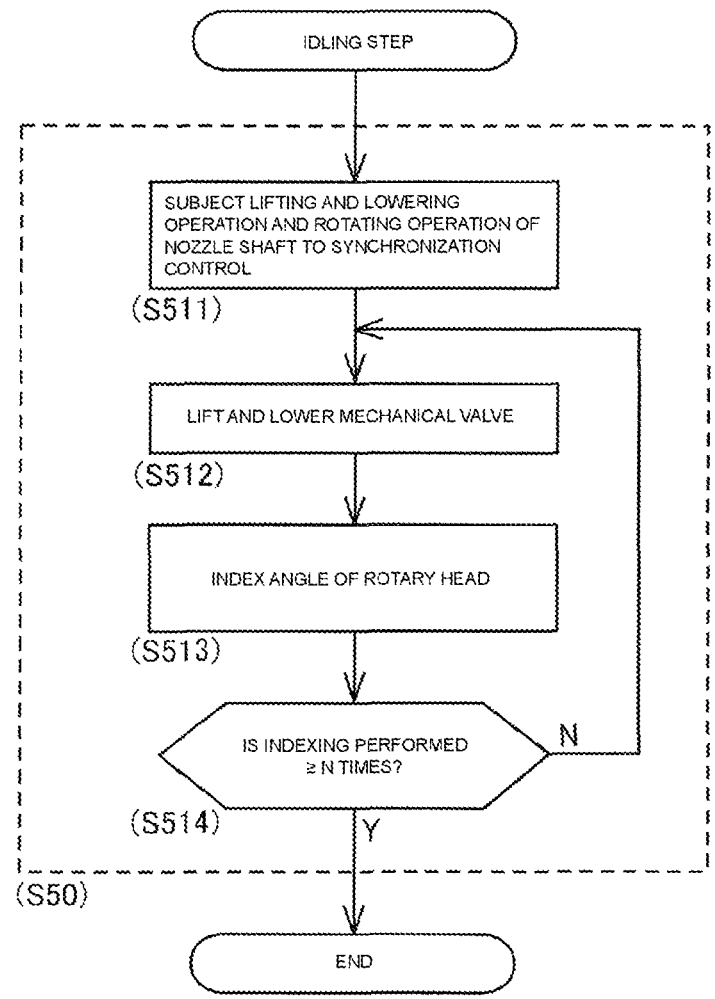

MOUNTING HEAD CLEANING DEVICE AND MOUNTING HEAD CLEANING METHOD

TECHNICAL FIELD

The present application relates to a mounting head cleaning device and a mounting head cleaning method which target a mounting head which is used in a component mounting machine which produces electronic circuit products.

BACKGROUND ART

The component mounting machine sucks an electronic component at a supply position using a suction nozzle, and mounts the electronic component at a predetermined coordinate position on a circuit board. The suction nozzle sucks the electronic component using negative pressure air which is supplied via an air passage which is formed in an inner portion of a mounting head. Therefore, dust from the tip of the suction nozzle or the like may be sucked into the air passage. The air passage of the mounting head is cleaned using a cleaning device which is disclosed in PTL 1, for example.

CITATION LIST

Patent Literature

PTL 1: JP-A-2011-3679

SUMMARY

In the cleaning of the air passage of the mounting head, it is desirable to more reliably remove the dust and to shorten the working time required for the cleaning. The present application is made in consideration of this situation, and an object thereof is to provide a mounting head cleaning device and a mounting head cleaning method which are capable of improving cleaning efficiency of an air passage targeting a mounting head.

A mounting head cleaning device according to an aspect targets a mounting head which is provided with a suction nozzle which sucks a component using negative pressure air supplied from a negative pressure air supply device via an air passage, and a nozzle shaft which holds the suction nozzle in a detachable manner and which is held to be capable of being lifted and lowered by a lifting and lowering mechanism and to be capable of being rotated by a rotation mechanism, and cleans the air path which is formed in an inner portion of the mounting head. The mounting head cleaning device includes a cleaning fluid supply device which supplies a cleaning fluid which is formed of positive pressure air or an oil mist to the air passage, and a control device which controls operations of the lifting and lowering mechanism and operations of the rotation mechanism such that the nozzle shaft is lifted and lowered and the nozzle shaft rotates around an axial line in synchronization with a lifting and lowering operation of the nozzle shaft in a cleaning process which uses the cleaning fluid supply device.

A mounting head cleaning method according to an aspect targets a mounting head which is provided with a suction nozzle which sucks a component using negative pressure air which is supplied by a negative pressure air supply device via an air passage, and a nozzle shaft which holds the suction nozzle in a detachable manner and which is held to be capable of being lifted and lowered by a lifting and lowering mechanism and to be capable of being rotated by a rotation mechanism, and cleans the air passage which is formed in an inner portion of the mounting head. The mounting head cleaning method includes, in a cleaning process which uses a cleaning fluid supply device which supplies a cleaning fluid which is formed of positive pressure air or an oil mist to the air passage, a nozzle shaft lifting and lowering step in which the lifting and lowering mechanism operates such that the nozzle shaft is lifted and lowered, and a nozzle shaft rotating step in which the rotation mechanism operates such that the nozzle shaft rotates around an axial line in synchronization with a lifting and lowering operation of the nozzle shaft in the nozzle shaft lifting and lowering step.

Effects

According to an aspect of the disclosure, in the cleaning process which uses the cleaning fluid supply device, the mounting head is rotated the nozzle shaft around an axial line in synchronization with the lifting and lowering operation of the nozzle shaft. Here, the nozzle shaft is held to be capable of being lifted and lowered and to be capable of rotating on the axis of the nozzle shaft in relation to the main body section of the mounting head. Therefore, the air passage which communicates the main body section of the mounting head with the nozzle shaft changes in accordance with the lifting and lowering operation and the rotating operation of the nozzle shaft. Accordingly, by causing the nozzle shaft to rotate around an axial line while lifting and lowering the nozzle shaft in the cleaning process, the part in the air passage which is cleaned is prevented from becoming uneven. Therefore, since the cleaning efficiency is improved, the time required for the cleaning process is shortened.

BRIEF DESCRIPTION OF DRAWINGS

FIG. 1 is an overall diagram illustrating a component mounting machine which is provided with a mounting head.

FIG. 2 is a diagram illustrating the mounting head in FIG. 1.

FIG. 3 is a sectional diagram illustrating an air passage of the mounting head.

FIG. 4 is a diagram illustrating a state in which the mounting head is attached to a moving table or a mounting head cleaning device.

FIG. 5 is an overall diagram illustrating the mounting head cleaning device in an embodiment.

FIG. 6 is a fluid supply circuit diagram which is formed by a cleaning fluid supply device.

FIG. 7 is a block diagram illustrating a control device of the mounting head cleaning device.

FIG. 8 is a flowchart illustrating a cleaning process.

FIG. 9 is a flowchart illustrating a cleaning step in the cleaning process.

FIG. 10 is a flowchart illustrating an air blasting step in the cleaning process.

FIG. 11 is a flowchart illustrating an idling step in the cleaning process.

DESCRIPTION OF EMBODIMENTS

Hereinafter, description will be given of embodiments which embody the mounting head cleaning device and the mounting head cleaning method of the present disclosure, with reference to the drawings. The mounting head cleaning device uses the mounting head which is used in the component mounting machine which produces electronic circuit products as a target and cleans the air passage which is formed in the inner portion of the mounting head.

The component mounting machine is a device which mounts a plurality of electronic components onto a circuit board. On the circuit board, cream solder is applied to mounting positions of the electronic components by a screen printer, and the circuit board is sequentially conveyed by a plurality of component mounting machines, and the electronic components are mounted thereon. Subsequently, the circuit boards onto which the electronic components are mounted become circuit board products each time a circuit board is conveyed to a reflow furnace to be soldered.

EMBODIMENT (1. Configuration of Component Mounting Machine)

Description will be given of the configuration of a component mounting machine 1 with reference to FIGS. 1 to 4. The component mounting machine 1 is configured to include a board conveyance device 10, a component supply device 20, and a component transfer device 30. The devices 10, 20, and 30 are provided on a base 2 of the component mounting machine 1. As illustrated in FIG. 1, a horizontal width direction of the component mounting machine 1 (direction heading from the upper left to the lower right in FIG. 1) is an X-axis direction, a horizontal longitudinal direction of the component mounting machine 1 (direction heading from the upper right to the lower left in FIG. 1) is a Y-axis direction, and a vertical height direction (vertical direction in FIG. 1) is a Z-axis direction.

(1-1. Board Conveyance Device 10)

The board conveyance device 10 conveys a circuit board B in the X-axis direction and positions the circuit board B in a predetermined position. The board conveyance device 10 is a double conveyor type device which is configured using a plurality of conveyance mechanisms 11 which are provided to line up in the Y-axis direction. The conveyance mechanism 11 includes a pair of guide rails 12 and 13 which guide the circuit board B which is placed on a conveyor belt which is not illustrated and is conveyed. During the mounting process of the electronic components, the conveyance mechanism 11 carries in the circuit board B to a predetermined position in the X-axis direction and clamps the circuit board B using a clamping device. When the electronic components are mounted onto the circuit board B, the conveyance mechanism 11 unclamps the circuit board B and conveys the circuit board B to the device exterior of the component mounting machine 1.

(1-2. Component Supply Device 20)

The component supply device 20 is a device which supplies the electronic components to be mounted onto the circuit board B. The component supply device 20 is disposed on the front portion side (the lower left side in FIG. 1) in the Y-axis direction of the component mounting machine 1. In the present embodiment, the component supply device 20 is a feeder system device which uses a plurality of cassette system feeders 21. The feeder 21 includes a feeder main body section 21a which is attached to the base 2 in a detachable manner, and a reel accommodation section 21b which is provided on the rear end side of the feeder main body section 21a. The feeder 21 uses the reel accommodation section 21b to hold a supply reel 22 in which a component wrapping tape is wound.

The component wrapping tape is formed of a carrier tape in which the electronic components are stored at a predetermined pitch, and a top tape which is adhered to the upper surface of the carrier tape and covers the electronic components. The feeder 21 pitch feeds the component wrapping tape pulled out from the supply reel 22 using a pitch feeding mechanism which is not illustrated to. The feeder 21 peels the top tape from the carrier tape to expose the electronic components. Accordingly, the feeder 21 performs the supplying of the electronic components at the supply position which is positioned on the front end side of the feeder main body section 21a such that a suction nozzle 46 of the component transfer device 30 is capable of sucking the electronic components.

(1-3. Component Transfer Device 30)

The component transfer device 30 holds the electronic component which is supplied to the supply position and transfers the electronic component to the mounting position on the circuit board B. In the present embodiment, the component transfer device 30 is a rectangular Cartesian coordinate type device which is disposed above the board conveyance device 10 and the component supply device 20. In the component transfer device 30, a Y-axis slide 32 which is capable of moving in the Y-axis direction is provided on a pair of Y-axis rails 31 which extend in the Y-axis direction.

The Y-axis slide 32 is controlled by the operation of a Y-axis motor 33 via a ball screw mechanism. A moving table 34 is provided on the Y-axis slide 32 to be capable of moving in the X-axis direction. The moving table 34 is controlled by the operation of an X-axis motor 35 via a ball screw mechanism which is not illustrated. In addition to the configuration described above, the Y-axis slide 32 and the moving table 34 may be configured to be provided in a linear motion mechanism using a linear motor, for example, and to be controlled by the operation of the linear motor.

A board camera 36 which images fiducial marks (not illustrated) of the circuit board B is attached to the moving table 34 of the component transfer device 30. The board camera 36 is fixed to the moving table 34 such that the optical axis becomes the Z-axis direction. The image data which is acquired through the imaging of the board camera 36 includes board marks (not illustrated) which are attached to the circuit board B, for example, and is used in the recognition of the positioning state of the circuit board B.

A mounting head 40 is attached to the moving table 34 of the component transfer device 30 in a detachable manner. As illustrated in FIG. 2, the mounting head 40 includes a head main body 41 which is clamped to the moving table 34. In the head main body 41, an index shaft 43, in which the rotational angle is indexed per predetermined angle, is supported to be capable of rotating by an R-axis motor 42. A rotary head 44 is fixed to the bottom end of the index shaft 43.

The rotary head 44 holds a plurality of (for example, 12) nozzle shafts 45 at an equal interval in the circumferential direction on a circular circumference which is concentric with the R-axis such that the nozzle shafts 45 are capable of sliding in the Z-axis direction and are capable of rotating. The nozzle shaft 45 is biased upward in relation to the rotary head 44 by an elastic force of a spring which is not illustrated. Accordingly, the nozzle shaft 45 is positioned at the lifting end in an ordinary state in which an external force is not applied.

The suction nozzle 46 is held in a detachable manner on the bottom end portion of the nozzle shaft 45. The suction nozzle 46 sucks a component using negative pressure air which is supplied via an air passage 60 from a negative pressure air supply device which is not illustrated. Description will be given later of the detailed configuration of the air passage 60. The plurality of suction nozzles 46 are sequentially indexed into predetermined angular positions (for example, the lifting and lowering positions of the nozzle shaft 45) around the R-axis due to the rotary head 44 rotating via the index shaft 43 according to the driving of the R-axis motor 42.

A rotating body 49 which is formed integrally with a driven gear 47 and a θ-axis gear 48 is disposed on the outer circumferential side of the index shaft 43 to be capable of rotating relative to the index shaft 43. A θ-axis motor 51 is fixed to the head main body 41. A driving gear 52, which is fixed to the output shaft of the θ-axis motor 51, meshes with the driven gear 47. The θ-axis gear 48 is formed such that the tooth width is a predetermined length in an axial line direction (the R-axis direction) of the rotating body 49.

A nozzle gear 53 is formed on the top end portion of the nozzle shaft 45. The nozzle gear 53 meshes, to be capable of sliding in the R-axis direction, with the θ-axis gear 48 which is supported to be capable of rotating relative to the outer circumferential side of the index shaft 43. The driven gear 47, the θ-axis gear 48, the θ-axis motor 51, the driving gear 52, and the nozzle gear 53 configure a rotation mechanism in the mounting head 40. The nozzle shaft 45 and the suction nozzle 46 integrally rotate (rotate on their own axes) around the θ-axis by the operation of the rotation mechanism and the rotation angle and the rotation speed thereof are controlled.

A nozzle actuating member 54 is provided on the head main body 41. The nozzle actuating member 54 is guided by a guide bar 55 to be capable of sliding in the vertical direction (the Z-axis direction). A Z-axis motor 56 which is fixed to the head main body 41 drives a ball screw mechanism 57. The nozzle actuating member 54 is lifted and lowered in the Z-axis direction due to the driving of the ball screw mechanism 57.

The nozzle actuating member 54 includes a nozzle lever 58 which comes into contact with the top end portion of, of the plurality of nozzle shafts 45, the nozzle shaft 45 which is indexed at the lifting and lowering position. The nozzle lever 58 is lowered in accordance with the movement of the nozzle actuating member 54 downward in the Z-axis direction, and pushes the nozzle shaft 45 with which the nozzle lever 58 comes into contact downward in the Z-axis direction. The nozzle actuating member 54, the guide bar 55, the Z-axis motor 56, the ball screw mechanism 57, and the nozzle lever 58 form a lifting and lowering mechanism in the mounting head 40. The nozzle shaft 45 and the suction nozzle 46 are integrally lifted and lowered in the Z-axis direction by the operation of the lifting and lowering mechanism, and control the Z-direction position and the movement speed.

As illustrated in FIG. 1, a component camera 5 is fixed to the base 2 such that the optical axis becomes the Z-axis direction. The component camera 5 is configured to be capable of imaging the electronic component in a state in which the electronic component is being held by the suction nozzle 46. The component camera 5 images the electronic component in the middle of the mounting head 40 moving from the component supply position of the component supply device 20 to the mounting position of the electronic component on the circuit board B. The component mounting machine 1 recognizes the holding state of the electronic component by the suction nozzle 46 based on the image data which is acquired through the imaging of the component camera 5. The component mounting machine 1 corrects the operation of the mounting head 40 according to the holding state of the electronic component and obtains an improvement in the accuracy of the mounting control.

(1-4. Detailed Configuration of Air Passage 60)

The air passage 60 which supplies the negative pressure air which is generated by a negative pressure air supply device (not illustrated) of the component mounting machine 1 to the suction nozzle 46 is formed in the inner portion of the mounting head 40. As illustrated in FIG. 3, the air passage 60 includes an in-shaft passage 61 and an in-head passage 62. As illustrated in FIG. 4, the air passage 60 includes an introduction passage 63 and a connecting pipe path 64.

As illustrated in FIG. 3, the in-shaft passage 61 is configured to join a pipe path which extends in the axial direction in the center portion of the nozzle shaft 45 to a annular groove which is formed on the outer circumferential side of the nozzle shaft 45. The in-head passage 62 is formed in the inner portion of the rotary head 44 to be capable of distributing the negative pressure air which is supplied to the rotary head 44 to the nozzle shafts 45. The in-head passage 62 is connected to be capable of allowing the negative pressure air or the like to flow between the in-head passage 62 and the annular groove in the in-shaft passage 61.

The mounting head 40 is provided with mechanical switching valves (hereinafter referred to as mechanical valves) 65, stepping motors 66, and actuating shafts 67. The mechanical valve 65 is a member which switches between the supplying and the blocking of the negative pressure air to the nozzle shaft 45. In the rotary head 44, the same number of the mechanical valves 65 are disposed as the nozzle shafts 45 which are held by the rotary head 44. The mechanical valve 65 is fitted to be capable of sliding in the vertical direction of the rotary head 44.

An engaging portion 65*a* is formed on the top end of the mechanical valve 65 at a part which protrudes from the top surface of the rotary head 44. The stepping motor 66 is fixed to the mounting head 40. The actuating shaft 67 is lifted and lowered by a predetermined amount through the driving of the stepping motor 66. The engaging section 65*a* of the mechanical valve 65 is configured to be capable of disengaging around the R-axis and to be capable of engaging in the Z-axis direction in relation to an engaging portion 67*a* of the actuating shaft 67. Accordingly, due to the indexing of the rotational angle of the rotary head 44, the engaging sections 65*a* of the plurality of mechanical valves 65 are sequentially engaged with the engaging section 67*a* of the actuating shaft 67.

The mechanical valve 65 is held by the rotary head 44 with a certain degree of friction force. In other words, the sliding in the vertical direction of the mechanical valve 65 caused by the weight of the mechanical valve 65 is restricted. Therefore, as long as no external force exceeding the friction force described above is applied to the mechanical valve 65, the mechanical valve 65 is held at the lifting end position or the lowering end position.

As illustrated in FIG. 3, the mechanical valve 65 enters an OFF state due to the movement to the lowering end position, and blocks the introduction of the negative pressure air, which is supplied to the inner portion of the mounting head 40, to the in-shaft passage 61 of the nozzle shaft 45. On the other hand, the mechanical valve 65 enters the ON state due to the movement to the lifting end position, and allows the introduction of the negative pressure air, which is supplied to the inner portion of the mounting head 40, to the in-shaft passage 61 of the nozzle shaft 45.

The in-head passage 62 of the rotary head 44 is joined to the introduction passage 63 which is formed in the head main body 41. As illustrated in FIG. 4, in a state in which the rotary head 44 is attached to the moving table 34 of the component transfer device 30 or the main body section of a mounting head cleaning device 70 which is described later, the introduction passage 63 introduces the negative pressure air or the like via the connecting pipe path 64. The connecting pipe path 64 is connected to a supply pipe path 88 which is provided on the moving table 34 or the main body section of the mounting head cleaning device 70.

(2. Configuration of Mounting Head Cleaning Device)
(2-1. Overall Configuration of Mounting Head Cleaning Device 70)

Description will be given of the configuration of the mounting head cleaning device 70 with reference to FIGS. 3 to 7. The mounting head cleaning device 70 is a device which cleans the air passage 60 which is formed in the inner portion of the mounting head 40. It is possible to adopt either a configuration in which the mounting head cleaning device 70 is provided in the inner portion of the component mounting machine 1, or a configuration in which the mounting head cleaning device 70 is an external device which is separate from the component mounting machine 1. Here, as illustrated in FIG. 5, an aspect in which the mounting head cleaning device 70 is an external device is exemplified.

The mounting head 40 which is provided with the rotary head 44 (refer to FIG. 2) is attached to the, mounting head cleaning device 70. The mounting head cleaning device 70 includes a clamp mechanism 71 to which the mounting head 40, which is removed from the component mounting machine 1, is fixed. The clamp mechanism 71 has the same configuration as the clamp mechanism (not illustrated) which clamps the mounting head 40 to the moving table 34 of the component mounting machine 1.

As illustrated in FIG. 4, the clamp mechanism 71 fixes the top portion of the mounting head 40 in a state in which a leg portion 41a which is formed on the bottom portion of the mounting head 40 is engaged with a leg section bearing section 72 which is formed on the main body section of the mounting head cleaning device 70. Accordingly, the mounting head 40 is positioned and fixed in relation to the main body section of the mounting head cleaning device 70. Accordingly, the connecting pipe path 64 of the mounting head 40 is connected to the supply pipe path 88 of the mounting head cleaning device 70, and it becomes possible to allow the flowing of the negative pressure air or the cleaning fluid.

As illustrated in FIG. 5, a suction blower 73 which sucks the cleaning fluid which is used in the cleaning of the air passage 60 of the mounting head 40 is provided on the mounting head cleaning device 70. The oil and dust which are collected by the suction blower 73 are collected in a collection box 74 which is provided on the bottom portion of the suction blower 73. Connectors of an electric system and a communication system are connected to the mounting head 40 in a state in which the mounting head 40 is fixed to the mounting head cleaning device 70. Accordingly, the mounting head 40 becomes capable of controlling the motors and the like using a control device 90 of the mounting head cleaning device 70.

(2-2. Cleaning Fluid Supply Device 80)

The mounting head cleaning device 70 is provided with the cleaning fluid supply device 80 which supplies the cleaning fluid, which is formed of positive pressure air or an oil mist, to the air passage 60 of the mounting head 40. The cleaning fluid supply device 80 forms the fluid supply circuit illustrated in FIG. 6. In the cleaning fluid supply device 80, a compressor 81 which is a positive pressure air supply source is connected to an air supply passage 82. A regulator valve 83 which adjusts the pressure of the air supply passage 82 is disposed in the air supply passage 82.

The air supply passage 82 is configured to be selectively connected to a cleaning air passage 85 and a cleaning oil passage 86 via a cleaning switching valve 84. The cleaning air passage 85 and the cleaning oil passage 86 are connected in front of the supply pipe path 88. A lubricator 87 is disposed in the cleaning oil passage 86. The lubricator 87 supplies mist-form oil to the cleaning oil passage 86 in a state in which the positive pressure air is being supplied to the cleaning oil passage 86. Accordingly, the oil mist is generated in the cleaning oil passage 86. As the oil which is supplied by the lubricator 87, for example, a mixture of a fluorine oil and a volatile solvent is used.

In this configuration, when the cleaning air passage 85 is connected to the air supply passage 82 through the switching of the cleaning switching valve 84, the positive pressure air is pumped into the supply pipe path 88 as the cleaning fluid. Meanwhile, when the cleaning oil passage 86 is connected to the air supply passage 82 through the switching of the cleaning switching valve 84, the oil mist is pumped into the supply pipe path 88 as the cleaning fluid. The supply pipe path 88 is connected, to be capable of supplying the cleaning fluid, to the connecting pipe path 64 of the mounting head 40 which is attached to the main body section of the mounting head cleaning device 70. According to this configuration, the cleaning fluid formed of the positive pressure air or the oil mist is supplied to the air passage 60 of the mounting head 40.

The suction blower 73 (refer to FIG. 6) is connected to the air supply passage 82 via a vacuum valve 89. The vacuum valve 89 is switched during the cleaning of the mounting head 40. Accordingly, the cleaning fluid which is discharged from the tip of the suction nozzle 46 of the mounting head 40 is sucked by the suction blower 73. In this manner, the mounting head cleaning device 70 is configured to prevent the cleaning fluid which is used in the cleaning from splashing in the surrounding area.

(2-3. Control Device 90)

In the cleaning process which uses the cleaning fluid supply device 80, the mounting head cleaning device 70 is provided with the control device 90 which controls the operations of the mounting head 40 and the cleaning fluid supply device 80. As illustrated in FIG. 7, the control device 90 includes a cleaning control section 91, a memory section 92, an input/output interface 93, and a motor control circuit 94.

The main constituent element of the cleaning control section 91 is a CPU. The cleaning control section 91 controls the operations of the motors 42, 51, 56, and 66 of the mounting head 40, the cleaning switching valve 84 of the cleaning fluid supply device 80, and the like based on signals which are output from a cleaning program which is stored in advance, and various sensors which are not illustrated. The memory section 92 is formed of an optical drive device, a flash memory, or the like. Various control data including the cleaning program is stored in the memory section 92.

The cleaning control section 91, the memory section 92, the motor control circuit 94, and various sensors are connected to the input/output interface 93 via a bus. The input/output interface 93 is interposed between the cleaning control section 91, the memory section 92, and the motor control circuit 94, and adjusts the data format conversion and the signal strength. The motor control circuit 94 controls the R-axis motor 42, the θ-axis motor 51, the Z-axis motor 56, and the stepping motor 66 of the mounting head 40 which is attached to the mounting head cleaning device 70.

(3. Cleaning Process by Mounting Head Cleaning Device)

Description will be given of the configuration relating to the cleaning process of the mounting head 40 by the mounting head cleaning device 70, with reference to FIGS. 6, and 8 to 11. The mounting head 40 is attached to the main body section of the mounting head cleaning device 70 in a state in which all of the suction nozzles 46 are removed from the nozzle shafts 45 during the cleaning process. When the mounting head 40 is attached, the connecting pipe path 64 of the mounting head 40 is connected to the supply pipe path 88 of the mounting head cleaning device 70.

Accordingly, the mounting head cleaning device 70 enters a state of being capable of supplying the cleaning fluid, which is formed of positive pressure air or an oil mist, from the cleaning fluid supply device 80 to the air passage 60 of the mounting head 40. Connectors of an electric system and a communication system are connected to the mounting head 40 and the mounting head cleaning device 70. Accordingly, the mounting head cleaning device 70 enters a state of being capable of controlling the motors and the like of the mounting head 40 using the control device 90.

(3-1. Outline of Cleaning Process)

In the present embodiment, a cleaning process which uses an oil mist is exemplified. As illustrated in FIG. 8, in the cleaning process, first, a cleaning step (step 10 (hereinafter, "step" will be denoted as "S")) is executed. The cleaning step (S10) is a step, of the cleaning process, in which the oil mist which is supplied by the cleaning fluid supply device 80 to the air passage 60 is ejected from the opening end of the air passage 60. Accordingly, the air passage 60 which is formed in the mounting head 40 is cleaned by the oil mist.

Next, an air blasting step (S30) is executed. The air blasting step (S30) is a step, of the cleaning process, in which the positive pressure air is supplied to the air passage 60 to remove the oil which remains in the air passage 60. Accordingly, the oil, which is adhered to the inner walls or the like of the air passage 60 due to the cleaning step (S10) which uses the oil mist, is ejected from the tip or the like of the nozzle shaft 45.

Next, an idling step (S50) is executed. The idling step (S50) is a step, of the cleaning process, which lifts or lowers the nozzle shaft 45 in a state in which the flow of the cleaning fluid in the air passage 60 is blocked, that is, in a state in which the mechanical valve 65 is OFF. Accordingly, the sliding portions of the nozzle shaft 45 and the mechanical valve 65 are lubricated by the oil which remains in the air passage 60.

(3-2. Details of Cleaning Step)

In the cleaning step (S10) in the cleaning process, as illustrated in FIG. 9, first, the rotary head 44 is moved to an origin position which serves as a reference by the rotation of the R-axis motor 42 (S111). Next, the rotary head 44 is indexed by a predetermined angle (S112). In a case in which there are N nozzle shafts 45 held by the rotary head 44, the "predetermined angle" is indicated by 360/N.

Next, the mechanical valve 65, which is provided corresponding to each nozzle shaft 45 (suction nozzle 46), is set to the OFF state by the driving of the stepping motor 66 (S113). Accordingly, the in-shaft passage 61 enters a closed state. The control device 90 determines whether or not the indexing of the rotational angle of the rotary head 44 is repeated N times (S114). In a case in which the number of repetitions is less than N times (S114: N), the steps S111 to S114 described above are repeated.

According to this process, all of the mechanical valves 65 corresponding to the nozzle shafts 45 enter the OFF state. In other words, the in-shaft passages 61 of the nozzle shafts 45 are reset to a closed state. In a case in which it is determined that the indexing of the rotational angle of the rotary head 44 reaches N times (S114: Y), the process transitions to S121. Here, the cleaning switching valve 84 is switched to the right side (the cleaning oil passage 86 side) of FIG. 6, and the vacuum valve 89 is switched to the left side of FIG. 6 (S121).

Therefore, the positive pressure air which is supplied from the compressor 81 to the air supply passage 82 is pumped into the cleaning oil passage 86 via the cleaning switching valve 84. When the positive pressure air flows in the cleaning oil passage 86, the mist form fluorine oil which is generated by the lubricator 87 is supplied to the cleaning oil passage 86. Accordingly, the oil mist which is the cleaning fluid is supplied to the supply pipe path 88 of the mounting head cleaning device 70.

The oil mist which is supplied to the supply pipe path 88 is introduced to the air passage 60 of the mounting head 40 via the connecting pipe path 64 of the mounting head 40. Due to the switching of the vacuum valve 89, the positive pressure air which is supplied to the air supply passage 82 is supplied to the suction blower 73 via the vacuum valve 89. Accordingly, the suction blower 73 enters an operating state.

Next, the mechanical valve 65 which corresponds to the first nozzle shaft 45 which is indexed at the lifting and lowering position is lifted by the stepping motor 66 and is set to the ON state (S122). Accordingly, the in-shaft passage 61 is opened to the first nozzle shaft 45. Therefore, the oil mist which is introduced to the introduction passage 63 of the mounting head 40 is supplied to the in-shaft passage 61 of the nozzle shaft 45 via the in-head passage 62. The oil mist is ejected from the tip of the nozzle shaft 45 which comes into contact with the opening end of the air passage 60 to the outside.

In this state, the control device 90 controls the operations of the lifting and lowering mechanism and the rotation mechanism of the mounting head 40 such that the nozzle shaft 45 is lifted and lowered, and the nozzle shaft 45 is rotated around an axial line (around the θ-axis) in synchronization with the lifting and lowering operation of the nozzle shaft 45 (S123). Specifically, the nozzle shaft 45 is first lifted and lowered over a plurality of times through the driving of the Z-axis motor 56 which configures the lifting and lowering mechanism. At this time, the nozzle shaft 45 is rotated by an angle which is set in advance each time a lifting and lowering operation of the nozzle shaft 45 is performed through the driving of the θ-axis motor 51 which configures the rotation mechanism.

The rotational angle of the nozzle shaft 45 is set such that the indexed angle at the time of the start of the lowering of the nozzle shaft 45 is different between consecutive lifting and lowering operations of the nozzle shaft 45. For example, in a case in which the rotational angle is set to 370°, the control device 90 causes the nozzle shaft 45 to rotate 185° at a time in the same direction during the lowering and during the lifting of the nozzle shaft 45. Accordingly, the indexed angle during the start of the lowering of the lifting and lowering operation of the next nozzle shaft 45 differs by 10° at a time.

In this manner, a nozzle shaft lifting and lowering step in which the lifting and lowering mechanism operates such that the nozzle shaft 45 is lifted and lowered, and a nozzle shaft rotating step in which the rotation mechanism operates such that the nozzle shaft 45 is rotated around the axial line in synchronization with the lifting and lowering operation of the nozzle shaft 45 are executed (S123). Accordingly, the dust and the like which enters the sliding portions (the fitting portions with the rotary head 44) of the air passage 60 and the nozzle shaft 45 is removed by the oil mist. The annular groove which is formed in the outer circumferential side of the nozzle shaft 45 is cleaned along the entire circumference due to the nozzle shaft 45 performing the rotation operation. The oil mist which is ejected from the tip of the nozzle shaft 45 is sucked by the suction blower 73.

Next, the mechanical valve 65 which corresponds to the nozzle shaft 45 in which the in-shaft passage 61 is cleaned is set to the OFF state again (S124). Accordingly, the in-shaft passage 61 is closed. The rotary head 44 is indexed by a predetermined angle (S125). The control device 90 determines whether or not the indexing of the rotational angle of the rotary head 44 is repeated N times (S126). In a case in which the number of repetitions is less than N times (S126: N), the steps S122 to S126 described above are repeated.

According to this process, the air passage 60 is sequentially formed by the in-shaft passage 61 of the 1st to N-th nozzle shafts 45, and the in-shaft passages 61 are sequentially cleaned. In a case in which the indexing of the rotational angle of the rotary head 44 is repeated N times (S126: Y), the air passage 60 which is formed by the in-shaft passage 61 of the N-th nozzle shaft 45 is in a cleaned state. Subsequently, the cleaning switching valve 84 and the vacuum valve 89 are switched to the respective origin positions (refer to FIG. 6) (S127). Accordingly, the supplying of the oil mist to the mounting head 40 and the supplying of the positive pressure air to the suction blower 73 are stopped.

(3-3. Details of Air Blasting Step)

As illustrated in FIG. 10, in the air blasting step (S30) of the cleaning process, first, the cleaning switching valve 84 is switched to the left side (the cleaning air passage 85 side) of FIG. 6, and the vacuum valve 89 is switched to the left side of FIG. 6 (S311). Therefore, the positive pressure air which is supplied from the compressor 81 to the air supply passage 82 is pumped into the cleaning air passage 85 via the cleaning switching valve 84. The positive pressure air which is supplied to the air supply passage 82 is supplied to the suction blower 73 via the vacuum valve 89. Accordingly, the suction blower 73 enters an operating state.

Next, the mechanical valve 65 which corresponds to the first nozzle shaft 45 which is indexed at the lifting and lowering position is set to the ON state (S312). Accordingly, the in-shaft passage 61 is released to the first nozzle shaft 45. Therefore, the positive pressure air which is introduced to the introduction passage 63 of the mounting head 40 is supplied to the in-shaft passage 61 of the nozzle shaft 45 via the in-head passage 62. The positive pressure air is ejected from the tip of the nozzle shaft 45 which comes into contact with the opening end of the air path 60 to the outside.

In this state, the control device 90 lifts and lowers the nozzle shaft 45 over a plurality of times, and causes the nozzle shaft 45 to rotate around an axial line (around the θ-axis) in synchronization with the lifting and lowering operation of the nozzle shaft 45 (S313). Since the synchronization control of the lifting and lowering operation and the rotating operation of the nozzle shaft 45 by the control device 90 is essentially the same as the synchronization control in S123 of the cleaning step (S10), detailed description will be omitted.

Due to the operation of the nozzle shaft 45, the oil which remain on the sliding portions of the air passage 60 and the nozzle shaft 45, and on the sliding portion of the mechanical valve 65 is blown off to be removed. The oil which remains in the annular groove which is formed in the outer circumferential side of the nozzle shaft 45 is removed along the entire circumference the same manner due to the nozzle shaft 45 performing the rotation operation. The oil which is removed in this manner is ejected from the tip of the nozzle shaft 45 together with the positive pressure air, and is sucked by the suction blower 73.

Next, the mechanical valve 65 which corresponds to the nozzle shaft 45 in which the oil of the in-shaft passage 61 is removed is set to the OFF state again (S314). Accordingly, the in-shaft passage 61 is closed. The rotary head 44 is indexed by a predetermined angle (S315). The control device 90 determines whether or not the indexing of the rotational angle of the rotary head 44 is repeated N times (S316). In a case in which the number of repetitions is less than N times (S316: N), the steps S312 to S316 described above are repeated.

According to this process, the air passage 60 is sequentially formed by the in-shaft passage 61 of the 1st to N-th nozzle shafts 45, and the oil which remains in the in-shaft passages 61 is sequentially removed. In a case in which the indexing of the rotational angle of the rotary head 44 is repeated N times (S316: Y), the air passage 60 which is formed by the in-shaft passage 61 of the N-th nozzle shaft 45 is in a state in which the remaining oil is removed. Subsequently, the cleaning switching valve 84 and the vacuum valve 89 are switched to the respective origin positions (refer to FIG. 6) (S317). Accordingly, the supplying of the positive pressure air to the mounting head 40 and the suction blower 73 is stopped.

(3-4. Details of Idling Step)

In the idling step (S50) in the cleaning process, is executed in a state in which the flowing of the cleaning fluid in the air passage 60 is blocked, that is, in a state in which the cleaning switching valve 84 is at the origin position (refer to FIG. 6) and the positive pressure air and the oil mist are not supplied to the mounting head 40.

In the state described above, as illustrated in FIG. 11, the control device 90 lifts and lowers the nozzle shaft 45, and causes the nozzle shaft 45 to rotate around an axial line (around the θ-axis) in synchronization with the lifting and lowering operation of the nozzle shaft 45 (S511). At this time, the control device 90 controls the operations of the lifting and lowering mechanism and the rotation mechanism of the mounting head 40 such that the rotational angle of the nozzle shaft 45 in a single lifting and lowering operation of the nozzle shaft 45 is greater than or equal to 360°.

Next, the mechanical valve 65 which corresponds to the first nozzle shaft 45 which is indexed at the lifting and lowering position is lifted and lowered (S512). Accordingly, the mechanical valve 65 is returned to the OFF state after being switched to the ON state. In this manner, when the nozzle shaft 45 and the mechanical valve 65 operate (S511, and S512), the sliding portions thereof slide due to the oil which is included in the cleaning fluid.

Next, the rotary head 44 is indexed by a predetermined angle (S513). The control device 90 determines whether or not the indexing of the rotational angle of the rotary head 44 is repeated N times (S514). In a case in which the number of repetitions is less than N times (S514: N), the steps S511 to S513 described above are repeated. According to this process, the 1st to N-th nozzle shafts 45 and mechanical valves 65 are sequentially subjected to an idling operation, and the sliding portions thereof are lubricated.

In a case in which the indexing of the rotational angle of the rotary head 44 is repeated N times (S514: Y), the N-th nozzle shaft 45 and the mechanical valve 65 which corresponds to the nozzle shaft 45 are in a state in which the idling operation is ended. Subsequently, the control device 90 ends the idling step (S50) and ends the cleaning process (refer to FIG. 8).

In the aspect described above, the control device 90 is configured to lift and lower one set of the nozzle shaft 45 and the mechanical valve 65 at a time. Conversely, the control device 90 may lift and lower the nozzle shaft 45 and the mechanical valve 65 over a plurality of times. In the idling step (S50), the flow of cleaning fluid is in a blocked state. Therefore, the control device 90 may execute, at the same time, synchronization control of the lifting and lowering operation and the rotating operation of the nozzle shaft 45 (S511), and control of the lifting and lowering operation of the mechanical valve 65 (S512).

(4. Effect of Configuration of Embodiment)

The mounting head cleaning device 70 and the mounting head cleaning method according to the present embodiment targets the mounting head 40 which is provided with the suction nozzle 46 which sucks a component using negative pressure air which is supplied via the air passage 60 by a negative pressure air supply device, and a nozzle shaft 45 which holds the suction nozzle 46 in a detachable manner, and is held to be capable of being lifted and lowered by the lifting and lowering mechanism and to be capable of being rotated on the axis of the nozzle shaft 45 by the rotation mechanism. The mounting head cleaning device 70 cleans the air passage 60 which is formed in the inner portion of the mounting head 40. The mounting head cleaning device 70 is provided with the cleaning fluid supply device 80 which supplies a cleaning fluid which is formed of the positive pressure air or the oil mist to the air passage 60, and the control device 90 which controls the operations of the lifting and lowering mechanism and the operations of the rotation mechanism such that the nozzle shaft 45 is lifted and lowered, and the nozzle shaft 45 is rotated around an axial line in synchronization with the lifting and lowering operation of the nozzle shaft 45 in the cleaning process which uses the cleaning fluid supply device 80. The mounting head cleaning method is provided with the nozzle shaft lifting and lowering step in which the lifting and lowering mechanism operates such that the nozzle shaft 45 is lifted and lowered in the cleaning process which uses the cleaning fluid supply device 80 which supplies the cleaning fluid which is formed of the positive pressure air or the oil mist to the air passage 60 (S123), and the nozzle shaft rotating step in which the rotation mechanism operates such that the nozzle shaft 45 is rotated around an axial line in synchronization with the lifting and lowering operation of the nozzle shaft 45 in the nozzle shaft lifting and lowering step (S123).

According to this configuration, the air passage 60 which is formed in the mounting head 40 is cleaned over the entirety thereof. In the present embodiment, the annular groove which is formed in the outer circumferential side of the nozzle shaft 45 is cleaned over the entire circumference, and the part which is cleaned in the air passage 60 is prevented from being uneven. Accordingly, the cleaning efficiency is improved, and the time which is required for the cleaning process is shortened.

In the present embodiment, the control device 90 causes the nozzle shaft 45 to rotate around an axial line in synchronization with the lifting and lowering operation of the nozzle shaft 45 in the cleaning step (S10), of the cleaning process, in which the cleaning fluid, which is supplied to the air passage 60 by the cleaning fluid supply device 80, is ejected from the opening end of the air passage 60 (S123).

Here, the nozzle shaft 45 is held to be capable of being lifted and lowered and to be capable of rotating in relation to the main body section of the mounting head 40. Therefore, the air passage 60 which communicates the main body section of the mounting head 40 with the nozzle shaft 45 expands and contracts in accordance with the lifting and lowering operation and the rotating operation of the nozzle shaft 45. In this configuration, by causing the nozzle shaft 45 to rotate around an axial line while lifting and lowering the nozzle shaft 45 in the cleaning step (S10) (S123), the cleaning fluid (the oil mist) flows uniformly in the air passage 60 which expands and contracts. Accordingly, the dust and the like which is sucked into the air passage 60 is reliably removed. Therefore, the cleaning efficiency is improved, and the time which is required for the cleaning process is shortened.

In the present embodiment, the cleaning fluid is the oil mist. In the air blasting step (S30), of the cleaning process, in which the positive pressure air is supplied to the air passage 60 to remove the oil which remains in the air passage 60, the control device 90 causes the nozzle shaft 45 to rotate around an axial line in synchronization with the lifting and lowering operation of the nozzle shaft 45 (S313).

According to this configuration, the oil which remains in the sliding portion of the nozzle shaft 45 and the air passage 60 is blown off to be removed. The oil which remains in the annular groove which is formed in the outer circumferential side of the nozzle shaft 45 is removed along the entire circumference the same manner due to the nozzle shaft 45 performing the rotation operation. A portion of the positive pressure air enters the sliding portion of the nozzle shaft 45. Accordingly, a portion of the oil which remains in the air passage 60 is pumped into the sliding portion of the nozzle shaft 45 in accordance with the flowing of the positive pressure air. Accordingly, the oil is supplied to the sliding portion, and the lubrication of the sliding portion is improved.

In the present embodiment, the cleaning fluid is the oil mist. In the idling step (S50), of the cleaning process, in which the nozzle shaft 45 is lifted and lowered in a state in which the flow of the cleaning fluid in the air passage 60 is blocked, the control device 90 causes the nozzle shaft 45 to rotate around an axial line in synchronization with the lifting and lowering operation of the nozzle shaft 45 (S511).

According to this configuration, the sliding portion of the nozzle shaft 45 is lubricated by the oil which is included in the oil mist. Accordingly, the lubrication of the nozzle shaft 45 is improved.

In the present embodiment, in a case in which the nozzle shaft 45 is lifted and lowered over a plurality of times, the rotational angle of the nozzle shaft 45 in a single lifting and lowering operation is set such that the indexed angle at the time of the start of the lowering of the nozzle shaft 45 is different between consecutive lifting and lowering operations. The control device 90 controls the operations of the lifting and lowering mechanism and the operations of the rotation mechanism based on the rotational angle of the nozzle shaft 45 which is set (S123, and S313).

According to this configuration, the indexed angle of the nozzle shaft 45 changes in relation to the position of the nozzle shaft 45 in the Z-direction. Accordingly, since the shape of the air passage 60 changes, the part which is cleaned in the air passage 60 is prevented from being uneven. Accordingly, the cleaning fluid flows uniformly in the air passage 60, the cleaning efficiency in the cleaning step (S10) is improved, and in the air blasting step (S30), the remaining oil is favorably removed.

In the present embodiment, in a case in which the control device 90 causes the nozzle shaft 45 to rotate around an axial line in synchronization with the lifting and lowering operation of the nozzle shaft 45, the control device 90 controls the operations of the lifting and lowering mechanism and the operations of the rotation mechanism such that the rotational angle of the nozzle shaft 45 in a single lifting and lowering operation is greater than or equal to 360° (S123, S313, and S511).

According to this configuration, the nozzle shaft 45 rotates over one or more revolutions in at least a single lifting and lowering operation. Accordingly, the shape of the air passage 60 which communicates between the rotary head 44 and the nozzle shaft 45 changes favorable, and the cleaning efficiency in the cleaning step (S10) is improved. In the air blasting step (S30), the remaining oil is favorably removed. In the idling step (S50), the sliding portion of the nozzle shaft 45 is favorably lubricated.

Modification Example of Embodiment (Regarding Cleaning Fluid)

In the embodiment, the cleaning process which uses the oil mist as the cleaning fluid is exemplified. In contrast, positive pressure air which does not include an oil may be used in the cleaning process as the cleaning fluid. Specifically, in S121 (refer to FIG. 9) of the cleaning step (S10), the cleaning switching valve 84 is switched to the left side (the cleaning air passage 85 side) of FIG. 6.

The positive pressure air which is supplied from the compressor 81 to the air supply passage 82 is pumped into the cleaning air passage 85 via the cleaning switching valve 84. Accordingly, the positive pressure air which is the cleaning fluid is supplied to the supply pipe path 88 of the mounting head cleaning device 70. In the cleaning process in which the positive pressure air is used as the cleaning fluid, the air blasting step (S30) in which the remaining oil is removed, and the idling step (S50) in which the lubrication is promoted by the oil become unnecessary.

(Regarding Synchronization Control Between Rotation Operations and Lifting and Lowering Operation of Nozzle Shaft)

In the embodiment, the nozzle shaft 45 is exemplified as a nozzle shaft in which the lifting and lowering operation and the rotating operation are controlled in synchronization in the following case. In other words, during the cleaning of the cleaning step (S10) (S123), during the removal of the oil of the air blasting step (S30) (S313), and during the lubrication of the idling step (S50) (S511), the rotating operation is controlled in synchronization with the lifting and lowering operation.

In contrast, the synchronization control of the nozzle shaft 45 may be executed in a combination of any of the above-described times, as appropriate. Additionally, the synchronization control of the nozzle shaft 45 may be executed in a state in which the air passage 60 is at a reduced pressure or an increased pressure. Specifically, the following aspects exist.

In other words, a dummy nozzle which blocks the air passage 60 may be mounted to the nozzle shaft 45 instead of the suction nozzle 46. For example, the dummy nozzle has the same external shape as the suction nozzle 46, and differs from the suction nozzle 46 in that the dummy nozzle does not include an opening portion on the tip portion. Accordingly, when the dummy nozzle is mounted to the nozzle shaft 45, the air passage 60 enters a state of being blocked at the end portion of the mounting head 40 side.

The control device 90 supplies the negative pressure air to the blocked air passage 60 to reduce the pressure of the air passage 60, or supplies the positive pressure air to increase the pressure of the air passage 60. When the air passage 60 has a reduced pressure or an increased pressure, the control device 90 lifts and lowers the nozzle shaft 45, and causes the nozzle shaft 45 to rotate around an axial line (around the θ-axis) in synchronization with the lifting and lowering operation. The control device 90 sequentially executes this in relation to the 1st to N-th nozzle shafts 45 in the same manner as in the cleaning step (S10) or the like.

In a case in which the air passage 60 is subjected to pressure reduction according to the synchronization control of the nozzle shaft 45, external gas flows in via the sliding portion of the nozzle shaft 45 and the sliding portion of the mechanical valve 65. In a case in which the air passage 60 is subjected to pressure increasing, the positive pressure air flows out to the outside via the sliding portion of the nozzle shaft 45 and the sliding portion of the mechanical valve 65. Accordingly, the dust and the like which enters the sliding portions is effectively removed. Since the oil is effectively pumped into the sliding portions, the sliding portions are favorably lubricated.

(Regarding Operations of Mechanical Valve in Cleaning Process)

In the embodiment, before and after the cleaning of the cleaning step (S10) (S122, and S124), and before and after the removal time of the oil of the air blasting step (S30) (S312, and S314), the mechanical valve 65 is lifted and lowered, and is switched to the ON state or the OFF state. In contrast, when the cleaning fluid is being supplied to the air passage 60 in the cleaning process, the control device 90 may perform the switching of the mechanical valve 65 over a plurality of times.

For example, during the cleaning (S123) of the cleaning step (S10), the mechanical valve 65 is switched to the OFF state for a short period and is switched to the ON state again so as to break up the supplying of the cleaning fluid. Accordingly, the control device 90 increases and decreases the pressure which acts on the air passage 60. Therefore, variation arises in the flow rate of the cleaning fluid in the air passage 60, and the dust and the like which accumulates in the air passage 60 is effectively removed.

REFERENCE SIGNS LIST

1: component mounting machine, 10: board conveyance device, 20: component supply device, 30: component transfer device, 40: mounting head, 45: nozzle shaft, 46: suction nozzle, 47: driven gear, 48: θ-axis gear, 51: θ-axis motor, 52: driving gear, 53: nozzle gear, 54: nozzle actuating member, 55: guide bar, 56: Z-axis motor, 57: ball screw mechanism, 58: nozzle lever, 60: air passage, 65: mechanical switching valve (mechanical valve), 70: mounting head cleaning device, 80: cleaning fluid supply device, 90: control device

The invention claimed is:

1. A mounting head cleaning device which targets a mounting head which is provided with a suction nozzle which sucks a component using negative pressure air which is supplied from a negative pressure air supply device via an air passage, and a nozzle shaft which holds the suction nozzle in a detachable manner and which is held to be capable of being lifted and lowered by a lifting and lowering mechanism and to be capable of being rotated by a rotation mechanism, and cleans the air passage which is formed in an inner portion of the mounting head, the mounting head cleaning device comprising:

a cleaning fluid supply device which supplies a cleaning fluid which is formed of an oil mist to the air passage; and a control device which controls operations of the lifting and lowering mechanism and operations of the rotation mechanism such that the nozzle shaft is lifted and lowered and the nozzle shaft rotates around an axial line in synchronization with a lifting and lowering operation of the nozzle shaft in a cleaning process which uses the cleaning fluid supply device, wherein in an idling step of the cleaning process, in which the nozzle shaft is lifted and lowered in a state in which a flow of the cleaning fluid in the air passage is blocked, the control device causes the nozzle shaft to rotate around the axial line in synchronization with the lifting and lowering operation of the nozzle shaft.

2. The mounting head cleaning device according to claim 1, wherein the control device causes the nozzle shaft to rotate around the axial line in synchronization with the lifting and lowering operation of the nozzle shaft in a cleaning step, of the cleaning process, in which the cleaning fluid, which is supplied to the air passage by the cleaning fluid supply device, is ejected from an opening end of the air passage.

3. The mounting head cleaning device according to claim 1, wherein in an air blasting step, of the cleaning process, in which positive pressure air is supplied to the air passage to remove oil which remains in the air passage, the control device causes the nozzle shaft to rotate around the axial line in synchronization with the lifting and lowering operation of the nozzle shaft.

4. The mounting head cleaning device according to claim 1, wherein a dummy nozzle which blocks the air passage is mounted on the nozzle shaft instead of the suction nozzle, and wherein when the negative pressure air is being supplied to the air passage or when positive pressure air is being supplied to the air passage, the control device causes the nozzle shaft to rotate around the axial line in synchronization with the lifting and lowering operation of the nozzle shaft.

5. The mounting head cleaning device according to claim 1, wherein the mounting head is provided with a valve which is capable of switching between supplying and blocking of the negative pressure air to the nozzle shaft, and wherein when the cleaning fluid is being supplied to the air passage in the cleaning process, the control device raises and lowers a pressure which acts on the air passage by performing switching of the valve over a plurality of times.

6. The mounting head cleaning device according to claim 1, wherein in a case in which the nozzle shaft is lifted and lowered over a plurality of times, a rotational angle of the nozzle shaft in a single lifting and lowering operation is set such that an indexed angle at a time of starting of lowering of the nozzle shaft is different between consecutive lifting and lowering operations, and wherein the control device controls operations of the lifting and lowering mechanism and operations of the rotation mechanism based on the rotational angle of the nozzle shaft which is set.

7. The mounting head cleaning device according to claim 1, wherein in a case in which the control device causes the nozzle shaft to rotate around the axial line in synchronization with the lifting and lowering operation of the nozzle shaft, the control device controls the operations of the lifting and lowering mechanism and the operations of the rotation mechanism such that the rotational angle of the nozzle shaft in a single lifting and lowering operation is greater than or equal to 360°.

* * * * *